(12) United States Patent
Sugino et al.

(10) Patent No.: US 6,558,975 B2
(45) Date of Patent: May 6, 2003

(54) PROCESS FOR PRODUCING SEMICONDUCTOR DEVICE

(75) Inventors: Takashi Sugino, Kawaguchi (JP);
Hideo Senoo, Kawaguchi (JP);
Kazuhiro Takahashi, Kawaguchi (JP)

(73) Assignee: Lintec Corporation, Tokyo (JP)

( * ) Notice: Subject to any disclaimer, the term of this patent is extended or adjusted under 35 U.S.C. 154(b) by 0 days.

(21) Appl. No.: 09/943,488

(22) Filed: Aug. 30, 2001

(65) Prior Publication Data
US 2002/0055238 A1 May 9, 2002

(30) Foreign Application Priority Data
Aug. 31, 2000 (JP) .......................... 2000-262238

(51) Int. Cl.⁷ ................. H01L 21/00; H01L 21/48; H01L 21/50; H01L 21/30; H01L 21/46
(52) U.S. Cl. ................. 438/64; 438/68; 438/118; 438/459; 438/460; 438/690
(58) Field of Search ................. 438/64, 68, 118, 438/459, 460, 464, 690; 29/413, 423, 846

(56) References Cited

U.S. PATENT DOCUMENTS

| | | | |
|---|---|---|---|
| 4,722,130 A | * 2/1988 | Kimura et al. | 29/413 |
| 5,762,744 A | * 6/1998 | Shibata et al. | 156/235 |
| 5,989,982 A | * 11/1999 | Yoshikazu | 438/462 |
| 6,054,372 A | * 4/2000 | Flesher et al. | 438/459 |
| 6,083,811 A | * 7/2000 | Riding et al. | 438/460 |
| 6,297,131 B1 | * 10/2001 | Yamada et al. | 438/464 |

FOREIGN PATENT DOCUMENTS

| | | |
|---|---|---|
| EP | 0981156 | * 2/2000 |
| JP | 59-121852 | * 7/1984 |
| JP | 60-196956 A | 10/1985 |
| JP | 60-223139 A | 11/1985 |
| JP | 62-4341 | * 1/1987 |
| JP | 2-032181 A | 3/1990 |
| JP | 5-32946 A | 2/1993 |
| JP | 5-335411 A | 12/1993 |
| JP | 8-027239 A | 1/1996 |
| JP | 8-053655 A | 2/1996 |
| JP | 8-239639 A | 9/1996 |
| JP | 9-100450 A | 4/1997 |
| JP | 9-202872 A | 8/1997 |
| JP | 11-305673 A | 11/1999 |
| JP | 11-340334 A | 12/1999 |
| JP | 2000-68237 A | 2/2000 |

* cited by examiner

*Primary Examiner*—Wael Fahmy
*Assistant Examiner*—Steven H. Rao
(74) *Attorney, Agent, or Firm*—Webb Ziesenheim Logsdon Orkin & Hanson, P.C.

(57) ABSTRACT

A process for producing a semiconductor device comprising the steps of providing a wafer having a surface furnished with semiconductor circuits and a back; forming grooves of a depth smaller than the thickness of the wafer, said grooves extending from the wafer circuit surface; sticking a surface protective sheet onto the wafer circuit surface; grinding the back of the wafer so that the thickness of the wafer is reduced, resulting in division of the wafer into individual chips with spaces therebetween; sticking a pressure sensitive adhesive sheet onto the ground back of the wafer, pressure sensitive adhesive sheet comprising a base and, superimposed thereon, an energy radiation curable pressure sensitive adhesive layer; exposing the energy radiation curable pressure sensitive adhesive layer to an energy radiation; and peeling the surface protective sheet from the wafer circuit surface.

6 Claims, 4 Drawing Sheets

PROCESS FOR PRODUCING SEMICONDUCTOR DEVICE

FIELD OF THE INVENTION

The present invention relates to a process for producing a semiconductor device and, more particularly, relates to a process for producing a semiconductor device which realizes excellent chip alignment to thereby enable improving a pickup efficiency.

Further, the present invention relates to a process for producing a semiconductor device and, more particularly, relates to a process for producing a semiconductor device in which not only can an appropriate amount of adhesive layer be easily formed on the back of extremely thin chips to thereby enable avoiding chip breakage, chip cracking or package cracking but also excellent chip alignment can be realized, so that a productivity enhancement can be realized.

BACKGROUND OF THE INVENTION

In recent years, the spread of IC cards has been promoted, and further reduction of the thickness thereof is now demanded. Accordingly, it is now required that the thickness of semiconductor chips, which has been about 350 $\mu$m, be reduced to 50–100 $\mu$m or less.

Such thin semiconductor chips can be obtained by first sticking a surface protective sheet to a circuit surface of a wafer, subsequently grinding the wafer back and thereafter dicing the wafer. When the thickness of the wafer after the grinding is extremely small, chip breakage and chip cracking are likely to occur at the time of the dicing of the wafer.

As another means for attaining the reduction of the chip thickness, Japanese Patent Laid-open Publication No. 5(1993)-335411 discloses a process for producing semiconductor chips, in which grooves of given depth are formed from a wafer surface and thereafter the back of the wafer is ground. Further, this publication discloses a method in which, after the step of grinding the wafer back, pellets (chips) adhering to a mounting tape are detached (picked up) from the mounting tape and secured to a lead frame.

In this method, misregistration of chips adhering to the mounting tape may occur to thereby cause a pickup apparatus to suffer recognition failure with the result that a production efficiency would be lowered.

When it is intended to pick up semiconductor chips stuck to a mounting tape and secure the picked semiconductor chips onto a substrate, it is common practice to employ the method known as "dispenser method" or the method in which a film adhesive is used.

In the dispenser method, a given amount of liquid adhesive is applied to sites of a substrate predetermined for securing semiconductor chips with the use of a dispenser, followed by press-bonding/fixing of semiconductor chips thereonto. However, this disperser method has drawbacks in that controlling the discharge amount of adhesive is difficult to thereby cause the adhesive amount to fluctuate, bringing about a variation of quality, and in that bleeding phenomenon occurs because the adhesive is liquid. When bleeding of the adhesive occurs, the adhesive may curl up to the upper surface of the chips, or the semiconductor chips may be inclined, so that failure is likely to occur at the time of wire bonding. Moreover, when packages, after resin sealing, are placed in high-temperature conditions, package cracking may be caused by volatile components which evaporate from any bled adhesive.

In the method in which a film adhesive is used, a film adhesive cut into substantially the same shape as that of the chip is adhered to sites of a substrate predetermined for fixing semiconductor chips in advance, or a film adhesive cut into substantially the same shape as that of the chip is adhered to chips, and the chips are fixed through the film adhesive to the substrate. However, in this method, it is required to cut the film adhesive into substantially the same shape as that of the chip in advance, so that practicing the method is time-consuming. Further, the work for adhering the film adhesive of the same extremely small size as that of the chip is requisite, so that the method is very laborious.

Even if any of the above means is employed, minute chips which have been ground to an extremely small thickness to thereby become very brittle are handled, so that chip breakage is likely to result from slight misoperation.

Therefore, there is a demand for the development of a method of easily and securely forming an adhesive layer on, especially, the back of chips.

With the intent to attain this task, the inventors, in Japanese Patent Application No. 11(1999)-340334, proposed "a process for producing a semiconductor device, comprising the steps of:

providing a wafer of given thickness having a surface furnished with semiconductor circuits and a back;

forming grooves of a cut depth smaller than the thickness of the wafer, the grooves extending from the wafer circuit surface;

sticking a surface protective sheet onto the wafer circuit surface;

grinding the back of the wafer so that the thickness of the wafer is reduced to thereby finally result in division of the wafer into individual chips with spaces therebetween;

sticking a dicing/die bond sheet onto the ground back of the wafer, the dicing/die bond sheet comprising a base and, superimposed thereon, an adhesive layer, the sticking performed so that the adhesive layer is brought into contact with the ground back of the wafer;

peeling the surface protective sheet from the wafer circuit surface to thereby cause the adhesive layer of the dicing/die bond sheet to be exposed through each space between neighboring individual chips;

cutting the exposed adhesive layer of the dicing/die bond sheet;

detaching the individual chips having the cut adhesive layer adhering thereto from the base of the dicing/die bond sheet; and bonding the individual chips through the adhesive layer to a given substrate."

This process enables easily and securely forming an appropriate amount of adhesive layer on the back of extremely thin chips.

However, when, after the sticking of the dicing/die bond sheet, the surface protective sheet is peeled, it may occur that the adhesive layer of the dicing/die bond sheet suffer strain to thereby result in misregistration of chips. Further, at the time of cutting of the adhesive layer, exposed between neighboring chips, of the dicing/die bond sheet, misregistration of chips may be caused by any vibration or flow of the adhesive layer. The misregistration of chips may cause a pickup apparatus to suffer recognition failure with the result that a production efficiency would be lowered.

The present invention has been made in view of the above state of the prior art. Therefore, it is an object of the present invention to provide a process for producing a semiconductor device which realizes excellent chip alignment to thereby enable improving a pickup efficiency. It is another object of the present invention to provide a process for producing a semiconductor device in which an appropriate amount of adhesive layer can easily be formed on the back of extremely thin chips to thereby enable avoiding chip breakage, chip cracking or package cracking, so that a productivity enhancement can be realized.

SUMMARY OF THE INVENTION

The first process for producing a semiconductor device according to the present invention comprises the steps of:

providing a wafer of given thickness having a surface furnished with semiconductor circuits and a back;

forming grooves of a cut depth smaller than the thickness of the wafer, the grooves extending from the wafer circuit surface;

sticking a surface protective sheet onto the wafer circuit surface;

grinding the back of the wafer so that the thickness of the wafer is reduced to thereby finally result in division of the wafer into individual chips with spaces therebetween;

sticking a pressure sensitive adhesive sheet for pickup step onto the ground back of the wafer, the pressure sensitive adhesive sheet for pickup step comprising a base and, superimposed thereon, an energy radiation curable pressure sensitive adhesive layer;

exposing the energy radiation curable pressure sensitive adhesive layer to an energy radiation; and peeling the surface protective sheet from the wafer circuit surface.

In this first process, the energy radiation curable pressure sensitive adhesive layer of the pressure sensitive adhesive sheet for pickup step is cured prior to the peeling of the surface protective sheet. Therefore, even when the surface protective sheet is peeling, the cured pressure sensitive adhesive layer is free from strain, so that excellent chip alignment is realized to thereby enable improving a pickup efficiency.

The second process for producing a semiconductor device according to the present invention comprises the steps of:

providing a wafer of given thickness having a surface furnished with semiconductor circuits and a back;

forming grooves of a cut depth smaller than the thickness of the wafer, the grooves extending from the wafer circuit surface;

sticking a surface protective sheet onto the wafer circuit surface;

grinding the back of the wafer so that the thickness of the wafer is reduced to thereby finally result in division of the wafer into individual chips with spaces therebetween;

sticking a dicing/die bond sheet onto the ground back of the wafer, the dicing/die bond sheet comprising a base and, superimposed thereon, an adhesive layer;

performing a primary curing of the adhesive layer;

cutting the adhesive layer of the dicing/die bond sheet between neighboring individual chips;

detaching the individual chips having the cut adhesive layer adhering thereto from the base of the dicing/die bond sheet;

attaching the individual chips through the adhesive layer to a given substrate; and performing a secondary curing of the adhesive layer to thereby secure the individual chips to the substrate.

The third process for producing a semiconductor device according to the present invention comprises the steps of:

providing a wafer of given thickness having a surface furnished with semiconductor circuits and a back;

forming grooves of a cut depth smaller than the thickness of the wafer, the grooves extending from the wafer circuit surface;

sticking a surface protective sheet onto the wafer circuit surface;

grinding the back of the wafer so that the thickness of the wafer is reduced to thereby finally result in division of the wafer into individual chips with spaces therebetween;

sticking a die bond sheet onto the ground back of the wafer, the die bond sheet comprising a base and, superimposed thereon, a thermoplastic adhesive layer;

cutting the thermoplastic adhesive layer of the die bond sheet between neighboring individual chips;

detaching the individual chips having the cut thermoplastic adhesive layer adhering thereto from the base of the die bond sheet;

attaching the individual chips through the thermoplastic adhesive layer to a given substrate; and heating the thermoplastic adhesive layer to thereby secure the individual chips to the substrate.

In the present invention, when the surface protective sheet has an energy radiation curable pressure sensitive adhesive layer, it is preferred that the energy radiation curable pressure sensitive adhesive layer of the surface protective sheet be cured after the sticking of the surface protective sheet to the wafer circuit surface but before the grinding of the back of the wafer.

In these second and third processes of the present invention, because the fluidity of each of the adhesive layer of the dicing/die bond sheet and the adhesive layer of the die bond sheet is lowered at the time of peeling of the surface protective sheet, any strain of the adhesive layer would not be caused by the peeling of the surface protective sheet. Thus, excellent chip alignment can be realized to thereby enable improving a pickup efficiency. Moreover, in particular, misregistration of chips at the cutting of the adhesive layer can be avoided, so that chip recognition by a pickup apparatus can be performed accurately to thereby enable efficiently performing the production of semiconductor devices.

DETAILED DESCRIPTION OF THE INVENTION

The present invention will be described in detail below with reference to the appended drawings.

At the beginning, the first process of the present invention will be described.

Figure 1:
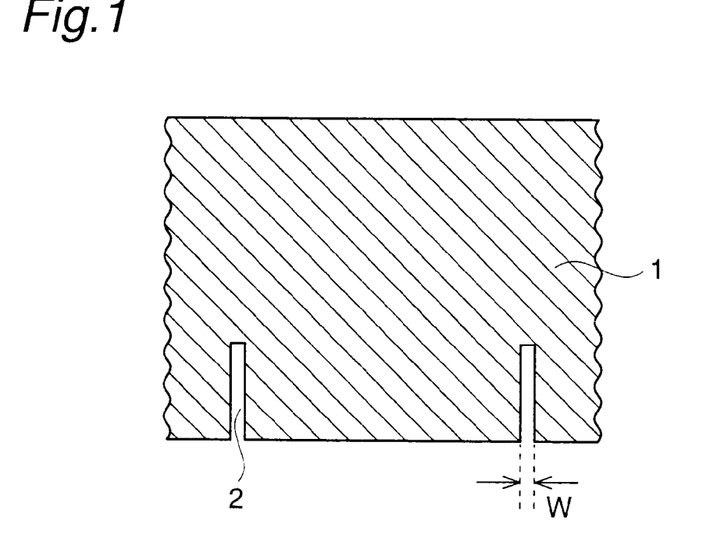
FIG. 1 shows the first step of the first to third processes for producing a semiconductor device according to the present invention.

First Step: Referring to FIG. 1, wafer 1 of given thickness having a surface furnished with semiconductor circuits and a back is provided, and grooves 2 of a cut depth smaller than the thickness of the wafer 1 are formed, which grooves extend from the wafer circuit surface. For example, grooves 2 of given depth extending from the surface of the wafer 1 are formed by cutting work along cut positions of the wafer 1 for partitioning a plurality of semiconductor circuits from each other.

The formation of grooves 2 by cutting work is performed with the use of conventional wafer dicing machine wherein the cut depth is appropriately regulated. At the cutting work, according to necessity, the wafer 1 may be fixed by means of, for example, a dicing tape commonly employed at the time of wafer dicing. The thickness of the wafer 1, although not particularly limited, is generally in the range of about 350 to 800 μm. The depth of the grooves 2 is appropriately determined in conformity with the thickness of the desired chips, which is generally in the range of about 20 to 500 μm. On the other hand, the width W of the grooves 2 is equal to the width of employed dicing blade, which is generally in the range of about 10 to 100 μm.

Figure 2:
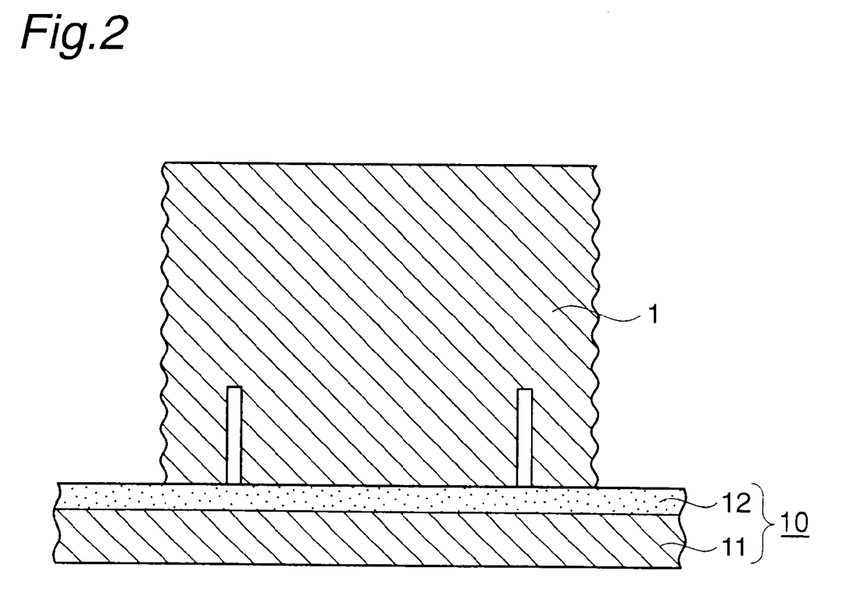
FIG. 2 shows the second step of the first to third processes for producing a semiconductor device according to the present invention.

Second Step: Referring to FIG. 2, surface protective sheet 10 is stuck to the circuit surface of the wafer 1. Specifically, the sticking of the surface protective sheet 10 is performed so as to cover the entire circuit surface of the wafer 1.

The surface protective sheet 10 comprises base 11 and, superimposed thereon, removable adhesive layer 12. The adhesive layer 12 has the property of being easily removed after an intended use. The removable adhesive layer 12 may be composed of an adhesive which is curable by energy radiation (energy rays or energy beams). The energy radiation curable adhesive has the property of being capable of fixing an adherend with satisfactory adhesive strength before exposure to energy radiation but being curable by exposure to energy radiation to thereby lose the adhesive strength and hence enable easy peeling.

Various protective sheets having commonly been employed for, for example, the protection of a variety of items and the processing of semiconductor wafer can be used as the above surface protective sheet 10. In particular, the surface protective sheets proposed by the applicants in Japanese Patent Laid-open Publication No. 2000-68237 and Japanese Patent Application No. 11(1999)-305673 are preferably employed in the present invention.

In the present invention, when the surface protective sheet 10 has an energy radiation curable pressure sensitive adhesive layer, it is preferred that the surface protective sheet 10 be stuck to the wafer circuit surface and the energy radiation curable pressure sensitive adhesive layer thereof be cured prior to the following steps. When the thickness of the semiconductor wafer is reduced by grinding the back of the semiconductor wafer, a lateral shear force applies to the semiconductor wafer. Therefore, if the pressure sensitive adhesive layer is soft, the chips may be moved laterally by the shear force to thereby cause misregistration of chips. However, the curing of the pressure sensitive adhesive layer by the above method enables avoiding the misregistration of chips even if a lateral force is applied. Further, any chip detachment and falling would not be caused by the lateral force to thereby enable avoiding a decrease of chip yield.

Figure 3:
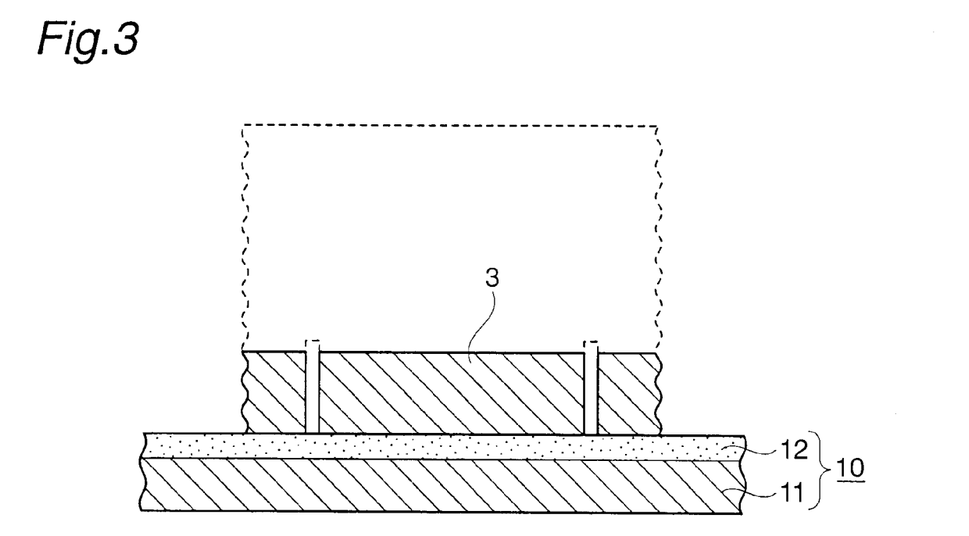
FIG. 3 shows the third step of the first to third processes for producing a semiconductor device according to the present invention.

Third Step: Referring to FIG. 3, the back of the semiconductor wafer 1 is ground so that the thickness of the semiconductor wafer 1 is reduced to thereby finally result in division of the semiconductor wafer 1 into individual chips 3 with spaces therebetween. Specifically, the bottoms of the grooves 2 are removed, and the grinding of the wafer 1 is continued until given thickness of the wafer 1 to thereby effect the division into individual chips 3. The grinding of the wafer back is performed by means of conventional back grinding machine.

Fourth Step: Pressure sensitive adhesive sheet for pickup step 20 is stuck to the ground back of the semiconductor wafer.

The pressure sensitive adhesive sheet for pickup step 20 comprises base 21 and, superimposed thereon, energy radiation curable pressure sensitive adhesive layer 22.

Various known energy radiation curable pressure sensitive adhesive components can be employed without any particular limitation in the energy radiation curable pressure sensitive adhesive which constitutes the energy radiation curable pressure sensitive adhesive layer 22. Generally, the energy radiation curable pressure sensitive adhesive comprises an acrylic pressure sensitive adhesive and an energy radiation polymerizable compound as principal components.

As the energy radiation polymerizable compound for use in the energy radiation curable pressure sensitive adhesive, there can widely be employed low-molecular-weight compounds having at least two photopolymerizable carbon to carbon double bonds in each molecule thereof which can provide a three-dimensional network structure by light irradiation, as disclosed in, for example, Japanese Patent Laid-open Publication Nos. 60(1985)-196956 and 60(1985)-223139.

The energy radiation curable pressure sensitive adhesive may be composed of an energy radiation curable copolymer having energy radiation polymerizable groups as side chains. Details of such an energy radiation curable copolymer are described in, for example, Japanese Patent Laid-open Publication Nos. 5(1993)-32946 and 8(1996)-27239.

Fifth Step: The pressure sensitive adhesive sheet for pickup step 20 is exposed to energy radiation.

For example, electron beams or ultraviolet rays are used as the energy radiation. Ultraviolet rays are especially preferably employed. Exposure to energy radiation is performed on the side of base 21. Therefore, when ultraviolet rays are used as the energy radiation, the base 21 must be transparent.

Sixth Step: The surface protective sheet 10 is peeled (see FIG. 4).

Figure 4:
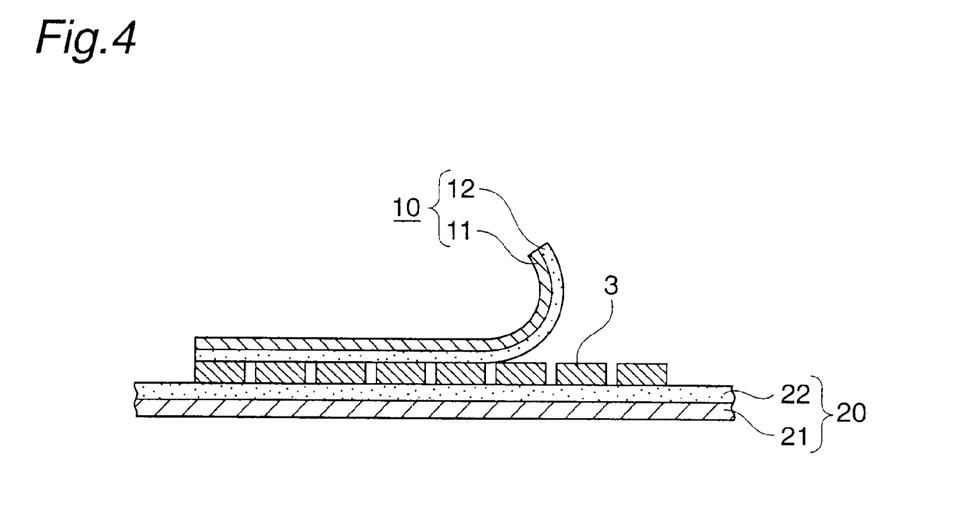
FIG. 4 shows the sixth step of the first process for producing a semiconductor device according to the present invention.

The energy radiation curable pressure sensitive adhesive layer 22 of the pressure sensitive adhesive sheet for pickup step 20 is cured by exposure to energy radiation in the above fifth step to thereby exhibit strong resistance to any lateral shear force. Therefore, after the curing of the energy radiation curable pressure sensitive adhesive layer 22 of the pressure sensitive adhesive sheet for pickup step 20, misregistration of chips would not be caused by the peeling of the surface protective sheet 10 to thereby enable maintaining an alignment of chips. Moreover, the adhesive strength is extremely reduced, vertical peeling of chips can be easily performed. At the peeling of the surface protective sheet 10, it is preferred to fix, by suction, the side of pressure sensitive adhesive sheet for pickup step 20.

Now, the second process of the present invention will be described.

The first to third steps thereof are the same as in the above first process.

Figure 5:
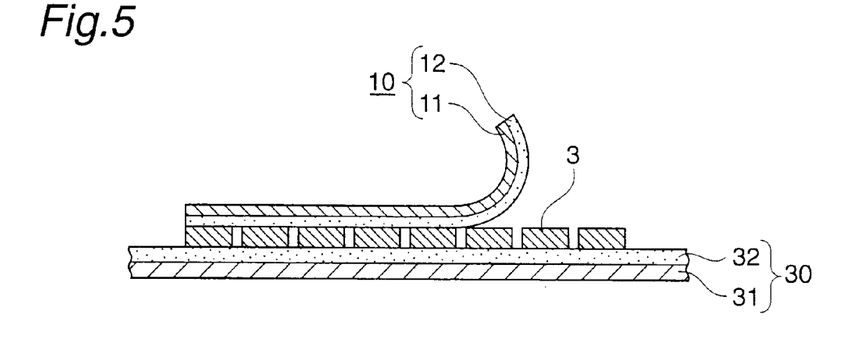
FIG. 5 shows the fourth step of the second process for producing a semiconductor device according to the present invention.

Fourth Step: Referring to FIG. 5, dicing/die bond sheet 30 is stuck onto the ground back of the wafer.

The dicing/die bond sheet 30 comprises base 31 and, superimposed thereon, adhesive layer 32. The adhesive layer 32 is so formed as to be detachable from the base 31. The adhesive layer 32 adheres to the chips 3 at room temperature or under mild thermo-press bonding conditions. When the chips 3 are picked up after the application of the adhesive layer 32 to the chips 3, the adhesive layer 32 remains adhering to the back of the chips 3 and is detached from the base 31.

Various sheets which are commonly employed in the dicing and die bonding of semiconductor wafers are used without any particular limitation as the above dicing/die bond sheet 30.

For example, use can be made of dicing/die bond sheets including an adhesive layer containing an energy radiation curable pressure sensitive adhesive component and a thermosetting adhesive component as essential components, as described in, for example, Japanese Patent Laid-open Publication Nos. 2(1990)-32181, 8(1996)-53655, 8(1996)-239639, 9(1997)-100450 and 9(1997)-202872.

After the sticking of the above dicing/die bond sheet 30 to the ground back of the wafer, the adhesive layer 32 is subjected to primary curing. In the use of dicing/die bond sheets including an adhesive layer containing an energy radiation curable pressure sensitive adhesive component and a thermosetting adhesive component as essential components, only the energy radiation curable pressure sensitive adhesive component can be cured (primary curing) by exposure to energy radiation. The primary curing of the adhesive layer 32 enables avoiding the misregistration of chips in the following fifth step.

Although, in the fourth step of FIG. 5, the surface protective sheet 10 is peeled after the sticking of the dicing/die bond sheet 30 to the ground back of the wafer, the timing of peeling the surface protective sheet 10 in the second process of the present invention is not particularly limited. The peeling of the surface protective sheet 10 may be carried out at any of the following fifth to seventh steps. When the surface protective sheet 10 is peeled in the above fourth step, it is preferred to fix, by suction, the side of dicing/die bond sheet 30.

Figure 6:
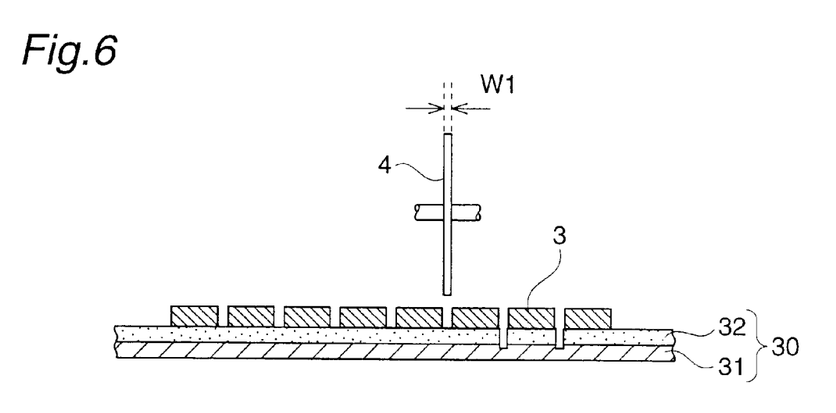
FIG. 6 shows the fifth step of the second process for producing a semiconductor device according to the present invention.

Fifth Step: Referring to FIG. 6, the adhesive layer of dicing/die bond sheet 30 between neighboring individual chips is cut.

In the fifth step, the adhesive layer 32 is fully cut by means of dicing blade 4. At the cutting, it is preferred that the dicing/die bond sheet 30 be fixed on a suction table. The width W1 of the dicing blade 4 is slightly smaller than the aforementioned width W of the grooves 2. For example, it is preferred that the width W1 be about 30 to 90% of the width W.

Although the depth of cut is satisfactory as long as the adhesive layer 32 can be fully cut, it is generally preferred that the cutting be performed to such an extent that the base 31 is partially cut to thereby complete the splitting of the adhesive layer 32 into pieces. As a result, the adhesive layer 32 is cut into pieces of substantially the same size and shape as those of the chips 3.

When the fifth step is carried out while the surface protective sheet 10 remains stuck to the wafer circuit surface, it is preferred to employ a transparent surface protective sheet in order to ascertain dicing lines.

Figure 7:
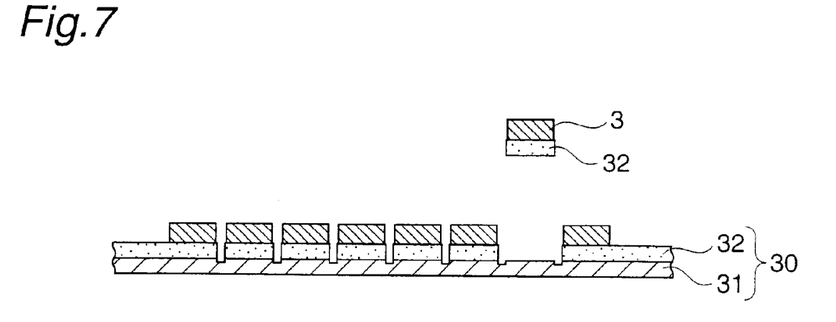
FIG. 7 shows the sixth step of the second process for producing a semiconductor device according to the present invention.

Sixth Step: Referring to FIG. 7, the adhesive layer 32 together with the chips 3 is detached from the base 31 of the dicing/die bond sheet 30. The adhesive layer 32, as aforementioned, is so formed as to be detachable from the base 31. Accordingly, when the chips 3 are picked up, the adhesive layer 32 remains adhering to the back of the chips 3 and is detached from the base 31.

When the adhesive layer 32 is constituted of the aforementioned adhesive containing an energy radiation curable pressure sensitive adhesive component and a thermosetting adhesive component as essential components, primary curing of the adhesive layer 32 is effected by exposure to energy radiation in the above fourth step with the result that the adhesive strength of the adhesive layer 32 is lowered. Therefore, the peeling of the adhesive layer 32 from the base 31 can be effectively accomplished.

Seventh Step: The individual chips 3 are bonded through the adhesive layer 32 to a given substrate (not shown). The back of the chips 3 is furnished with the adhesive layer 32 in the above step 6. The chips 3 can be secured onto a substrate by disposing the chips 3 through the adhesive layer 32 on the substrate and by causing the adhesive layer 32 to exert its adhesive strength by required means.

When the adhesive layer 32 is composed of the aforementioned adhesive containing an energy radiation curable pressure sensitive adhesive component and a thermosetting adhesive component as essential components, the bonding capability of the thermosetting adhesive component can be exerted by heating to thereby enable strongly bonding the chips 3 and the substrate to each other.

The third process of the present invention will be described below.

The first to third steps thereof are the same as in the above first process.

Figure 8:
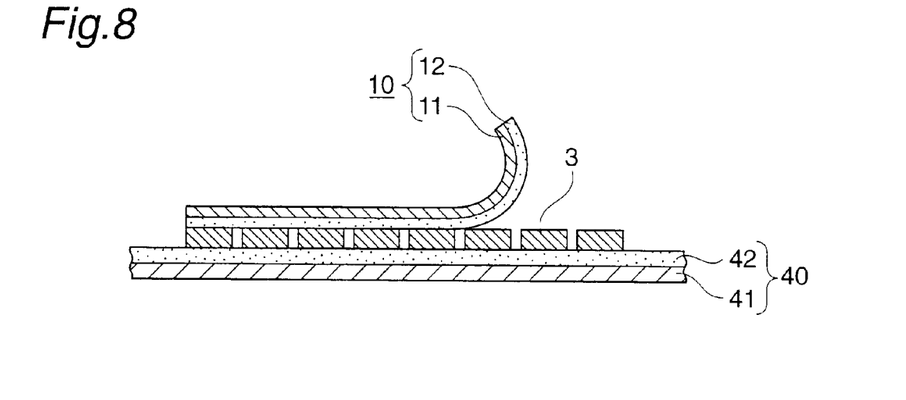
FIG. 8 shows the fourth step of the third process for producing a semiconductor device according to the present invention.

Fourth Step: Referring to FIG. 8, die bond sheet 40 is stuck onto the ground back of the wafer.

The die bond sheet 40 comprises base 41 and, superimposed thereon, thermoplastic adhesive layer 42. The thermoplastic adhesive layer 42 is so formed as to be detachable from the base 41. The thermoplastic adhesive layer 42 can be adhered to the chips 3 under mild thermo-press bonding conditions. When the chips 3 are picked up after the adhering of the thermoplastic adhesive layer 42 to the chips 3, the thermoplastic adhesive layer 42 remains adhering to the back of the chips 3 and is detached from the base 41.

The thermoplastic adhesive layer 42 is constituted of, for example, any of polyester resins, polyvinyl acetate, polyvinyl alcohol, polyvinylbutyral, polyvinyl chloride, polymethacrylates, polyacrylates, polystyrene, polyethylene, polyamides, cellulose, polyisobutylene, polyvinyl ether, polyimide resins and various hot melt adhesives. The thermoplastic adhesive layer 42 is preferably comprising polyester resins or polyimide resins.

After the thermo-press bonding of the above die bond sheet 40 to the ground back of the wafer, the die bond sheet 40 is allowed to cool. The cooling of the adhesive layer 42 enables avoiding the misregistration of chips in the following fifth step.

Although, in the fourth step of FIG. 8, the surface protective sheet 10 is peeled after the sticking of the die bond sheet 40 to the ground back of the wafer, the timing of peeling the surface protective sheet 10 is not particularly limited as similar to the above second process. The peeling of the surface protective sheet 10 may be carried out at any of the following fifth to seventh steps.

Figure 9:
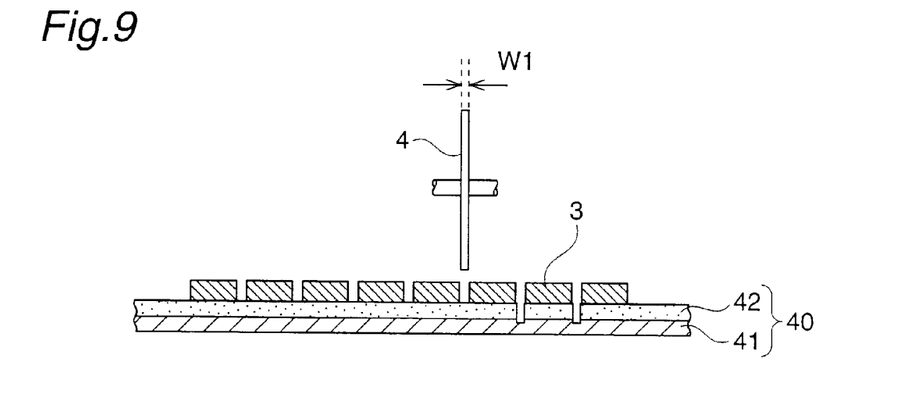
FIG. 9 shows the fifth step of the third process for producing a semiconductor device according to the present invention.

Fifth Step: Referring to FIG. 9, the adhesive layer 42 of die bond sheet 40 between neighboring individual chips is cut.

In the fifth step, the adhesive layer 42 is fully cut by means of dicing blade 4. At the cutting, it is preferred that the die bond sheet 40 be fixed on a suction table. The width W1 of the dicing blade 4, cut depth, etc. are the same as in the above second process.

When the fifth step is carried out while the surface protective sheet 10 remains stuck to the wafer circuit surface, it is preferred to employ a transparent surface protective sheet in order to ascertain dicing lines.

Figure 10:
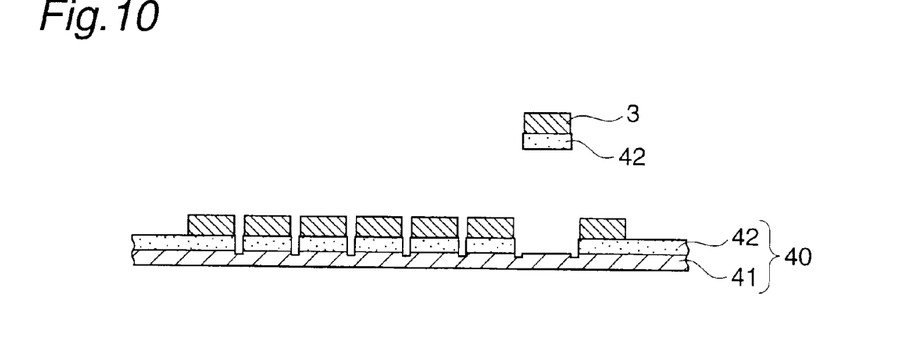
FIG. 10 shows the sixth step of the third process for producing a semiconductor device according to the present invention.

Sixth Step: Referring to FIG. 10, the adhesive layer 42 together with the chips 3 is detached from the base 41 of the die bond sheet 40. The adhesive layer 42, as aforementioned, is so formed as to be detachable from the base 41. Accordingly, when the chips 3 are picked up, the adhesive layer 42 remains adhering to the back of the chips 3 and is detached from the base 41.

Seventh Step: The individual chips 3 are bonded through the adhesive layer 42 to a given substrate (not shown). The back of the chips 3 is furnished with the thermoplastic adhesive layer 42 in the above step 6. Thus, the chips 3 can be strongly secured onto the substrate by disposing the chips 3 on the substrate and by effecting a thermo-press bonding thereof.

As apparent from the foregoing, the first process for producing a semiconductor device according to the present invention realizes excellent chip alignment to thereby enable improving a pickup efficiency.

The second and third processes for producing a semiconductor device according to the present invention enable easily forming an appropriate amount of adhesive layer on the back of extremely thin chips to thereby enable avoiding chip breakage, chip cracking or package cracking while ensuring excellent chip alignment, so that a productivity enhancement can be realized.

EXAMPLE

The present invention will further be illustrated below with reference to the following Examples which in no way limit the scope of the invention.

Hereinbelow, the "evaluation of chip alignment", "chipping test" and "package crack test" were performed in the following manner.

"Evaluation of Chip Alignment"

Grooves were formed in the parallel direction (x-direction) and the perpendicular direction (y-direction) to an orientation flat of wafer. Dislocations between the positions of grooves at intersecting points (8 points) formed by mutual crossings of the fifth grooves up, down, right and left from the center of the wafer, among the intersecting points of x-direction grooves and y-direction grooves, and the positions of inter-chip lines corresponding to the above grooves after the division into chips were measured by means of wafer dicer (model A-WD-4000B, manufactured by Tokyo Seimitsu) with the use of alignment function thereof. The maximum of the x-direction and y-direction dislocations was expressed as the variation, whereby the chip alignment was evaluated.

"Chipping Test"

Sides of 50 samples of each of the silicon chips having adhesive produced in the following Examples 1 to 4 and silicon chips produced in the following Examples 5 and 6 and Comparative Example 1 were observed through an optical microscope with respect to chip breakage and presence of cracking.

"Package Crack Test"

Silicon chips secured to a lead frame, produced in the following Examples 1 to 4, were sealed under high pressure with the use of given sealant resin (biphenyl epoxy resin). The resin was cured at 175° C. for 6 hr. In this manner, 100 packages for the package crack test were obtained. Each of the packages was allowed to stand still at high temperature in high humidity (85° C., 85% RH) for 168 hr. Thereafter, each package was allowed to stand still for 1 min in the same environment (215° C.) as in VPS (Vapor Phase Soldering), and cooled to room temperature. These were carried out thrice, and any cracking of the sealant resin was inspected by SAT (Scanning Acoustic Tomography). The package cracking ratio is a proportion of the number of cracked packages to the number of inspected packages (namely 100).

The wafer dicing machine, back grinding machine and surface protective sheet employed in the following Examples and Comparative Example were as follows.

Wafer dicing machine: DAD 2H/6T manufactured by Disco Corporation,

Back grinding machine: DFG 850 manufactured by Disco Corporation, and

Surface protective sheet: Adwill E-6142S produced by LINTEC Corporation.

Example 1

Grooves were formed on a silicon wafer of 6 inch diameter and 625 $\mu$m thickness by the use of the above wafer dicing machine using a 35 $\mu$m thick blade under conditions such that the cut depth was 150 $\mu$m and the chip size was 10 mm-square. Subsequently, the above surface protective sheet was stuck to the grooved surface of the silicon wafer and exposed to ultraviolet light. The back of the silicon wafer was ground by means of the above back grinding machine until the wafer thickness became 80 $\mu$m to thereby effect division of the silicon wafer into individual chips. Thereafter, dicing/die bond sheet (Adwill LE5000 produced by LINTEC Corporation) was stuck to the ground back of the silicon wafer. The dicing/die bond sheet was exposed to ultraviolet light, thereby effecting a primary curing of the adhesive layer of the dicing/die bond sheet. The surface protective sheet was peeled off, and the adhesive layer lying between neighboring divided individual silicon chips was cut by the use of the wafer dicing machine using a 30 $\mu$m thick blade under conditions such that the cut depth was 35 $\mu$m. After this operation, the chip alignment thereof was evaluated.

The divided individual silicon chips were picked up from the dicing/die bond sheet, and the silicon chips having the adhesive layer were directly bonded to die pad portions of a lead frame. The adhesive layer was heated at 160° C. for 30 min, thereby effecting a secondary curing of the adhesive layer. Thus, bonding of the chips was accomplished.

Example 2

Grooves were formed on a silicon wafer of 6 inch diameter and 625 $\mu$m thickness by the use of the above wafer dicing machine using a 35 $\mu$m thick blade under conditions such that the cut depth was 150 $\mu$m and the chip size was 10 mm-square. Subsequently, the above surface protective sheet was stuck to the grooved surface of the silicon wafer and exposed to ultraviolet light. The back of the silicon wafer was ground by means of the above back grinding machine until the wafer thickness became 80 $\mu$m to thereby effect division of the silicon wafer into individual chips. Thereafter, dicing/die bond sheet (Adwill LE5000 produced by LINTEC Corporation) was stuck to the ground back of the silicon wafer. The dicing/die bond sheet was exposed to ultraviolet light, thereby effecting a primary curing of the adhesive layer of the dicing/die bond sheet. Then, the side of dicing/die bond sheet was fixed on a suction table, and the surface protective sheet was peeled off. The adhesive layer lying between neighboring divided individual silicon chips was cut by the use of the wafer dicing machine using a 30 $\mu$m thick blade under conditions such that the cut depth was 65 $\mu$m. After this operation, the chip alignment thereof was evaluated.

The divided individual silicon chips were picked up from the dicing/die bond sheet, and the silicon chips having the adhesive layer were directly bonded to die pad portions of a lead frame. The adhesive layer was heated at 160° C. for 30 min, thereby effecting a secondary curing of the adhesive layer. Thus, bonding of the chips was accomplished.

Example 3

Grooves were formed on a silicon wafer of 6 inch diameter and 625 $\mu$m thickness by the use of the above wafer dicing machine using a 35 $\mu$m thick blade under conditions such that the cut depth was 150 $\mu$m and the chip size was 10 mm-square. Subsequently, the above surface protective sheet was stuck to the grooved surface of the silicon wafer and exposed to ultraviolet light. The back of the silicon wafer was ground by means of the above back grinding machine until the wafer thickness became 80 $\mu$m to thereby effect division of the silicon wafer into individual chips. Thereafter, dicing/die bond sheet (Adwill LE5000 produced by LINTEC Corporation) was stuck to the ground back of the silicon wafer. The dicing/die bond sheet was exposed to ultraviolet light, thereby effecting a primary curing of the adhesive layer of the dicing/die bond sheet. Then, the adhesive layer lying between neighboring divided individual silicon chips, together with the surface protective sheet, was cut by the use of the wafer dicing machine using a 30 $\mu$m thick blade under conditions such that the cut depth was 65 $\mu$m. After this operation, the chip alignment thereof was evaluated.

The surface protective sheet was peeled off. The divided individual silicon chips were picked up from the dicing/die bond sheet, and the silicon chips having the adhesive layer were directly bonded to die pad portions of a lead frame. The adhesive layer was heated at 160° C. for 30 min, thereby effecting a secondary curing of the adhesive layer. Thus, bonding of the chips was accomplished.

Example 4

Grooves were formed on a silicon wafer of 6 inch diameter and 625 $\mu$m thickness by the use of the above wafer dicing machine using a 35 $\mu$m thick blade under conditions such that the cut depth was 150 $\mu$m and the chip size was 10 mm-square. Subsequently, the above surface protective sheet was stuck to the grooved surface of the silicon wafer and exposed to ultraviolet light. The back of the silicon wafer was ground by means of the above back grinding machine until the wafer thickness became 80 $\mu$m to thereby effect division of the silicon wafer into individual chips. Thereafter, a die bond sheet furnished with a thermoplastic adhesive layer of a polyimide was stuck to the ground back of the silicon wafer. A thermo-press bonding thereof was carried out at 130° C., followed by cooling to room temperature. Further, dicing tape (Adwill D-650 produced by LINTEC Corporation) was stuck and secured to the side of die bond sheet. Then, the adhesive layer lying between neighboring divided individual silicon chips, together with the surface protective sheet, was cut by the use of the wafer dicing machine using a 30 $\mu$m thick blade under conditions such that the cut depth was 65 $\mu$m. After this operation, the chip alignment thereof was evaluated.

The divided individual silicon chips were picked up from the die bond sheet, and the silicon chips having the adhesive layer were directly bonded to die pad portions of a lead frame. The surface protective sheet was peeled off, and the adhesive layer was heated at 130° C. and allowed to cool. Thus, bonding of the chips was accomplished.

Example 5

Grooves were formed on a silicon wafer of 6 inch diameter and 625 $\mu$m thickness by the use of the above wafer dicing machine using a 35 $\mu$m thick blade under conditions such that the cut depth was 150 $\mu$m and the chip size was 10 mm-square. Subsequently, the above surface protective sheet was stuck to the grooved surface of the silicon wafer. The back of the silicon wafer was ground by means of the above back grinding machine until the wafer thickness became 80 $\mu$m to thereby effect division of the silicon wafer into individual chips. Thereafter, the surface protective sheet was exposed to ultraviolet light, and pressure sensitive adhesive sheet for pickup step (Adwill D-675 produced by LINTEC Corporation) was stuck to the ground back of the silicon wafer. The pressure sensitive adhesive sheet for pickup step was exposed to ultraviolet light, thereby curing the pressure sensitive adhesive layer of the pressure sensitive adhesive sheet. The surface protective sheet was peeled off, and, after this operation, the chip alignment was evaluated.

Example 6

Grooves were formed on a silicon wafer of 6 inch diameter and 625 $\mu$m thickness by the use of the above wafer dicing machine using a 35 $\mu$m thick blade under conditions such that the cut depth was 150 $\mu$m and the chip size was 10 mm-square. Subsequently, the above surface protective sheet was stuck to the grooved surface of the silicon wafer and exposed to ultraviolet light. The back of the silicon wafer was ground by means of the above back grinding machine until the wafer thickness became 80 $\mu$m to thereby effect division of the silicon wafer into individual chips. Thereafter, pressure sensitive adhesive sheet for pickup step (Adwill D-675 produced by LINTEC Corporation) was stuck to the ground back of the silicon wafer. The pressure sensitive adhesive sheet for pickup step was exposed to ultraviolet light, thereby curing the pressure sensitive adhesive layer of the pressure sensitive adhesive sheet. The surface protective sheet was peeled off, and, after this operation, the chip alignment was evaluated.

Comparative Example 1

Grooves were formed on a silicon wafer of 6 inch diameter and 625 μm thickness by the use of the above wafer dicing machine using a 35 μm thick blade under conditions such that the cut depth was 150 μm and the chip size was 10 mm-square. Subsequently, the above surface protective sheet was stuck to the grooved surface of the silicon wafer. The back of the silicon wafer was ground by means of the above back grinding machine until the wafer thickness became 80 μm to thereby effect division of the silicon wafer into individual chips. Thereafter, the surface protective sheet was exposed to ultraviolet light, and pressure sensitive adhesive sheet for pickup step (Adwill D-675 produced by LINTEC Corporation) was stuck to the ground back of the silicon wafer. The surface protective sheet was peeled off. The pressure sensitive adhesive sheet for pickup step was exposed to ultraviolet light, thereby curing the pressure sensitive adhesive layer of the pressure sensitive adhesive sheet. After this operation, the chip alignment was evaluated.

TABLE 1

| Evaluation of chip alignment | Evaluation Result | | | | | | |
|---|---|---|---|---|---|---|---|
| | Ex. 1 | Ex. 2 | Ex. 3 | Ex. 4 | Ex. 5 | Ex. 6 | Comp. Ex. 1 |
| x-direction variation value (μm) | 3 | 4 | 4 | 6 | 10 | 3 | 189 |
| y-direction variation value (μm) | 3 | 5 | 3 | 6 | 6 | 3 | 199 |
| Chip breakage/cracking | none | none | none | none | none | none | none |
| Package cracking occurrence (%) | 0 | 0 | 0 | 0 | — | — | — |

What is claimed is:

1. A process for producing a semiconductor device, comprising the steps of:
   providing a wafer of given thickness having a surface furnished with semiconductor circuits and a back;
   forming grooves of a cut depth smaller than the thickness of the wafer, said grooves extending from the wafer circuit surface;
   sticking a surface protective sheet onto the wafer circuit surface;
   grinding the back of the wafer so that the thickness of the wafer is reduced to a thickness whereby the grooves are exposed at the back surface which results in a division of the wafer into individual chips with spaces therebetween;
   sticking a pressure sensitive adhesive sheet for pickup step onto the ground back of the wafer, said pressure sensitive adhesive sheet for pickup step comprising a base and, superimposed thereon, an energy radiation curable pressure sensitive adhesive layer;
   exposing the energy radiation curable pressure sensitive adhesive layer to an energy radiation; and
   peeling the surface protective sheet from the wafer circuit surface.

2. A process for producing a semiconductor device, comprising the steps of:
   providing a wafer of given thickness having a surface furnished with semiconductor circuits and a back;
   forming grooves of a cut depth smaller than the thickness of the wafer, said grooves extending from the wafer circuit surface;
   sticking a surface protective sheet onto the wafer circuit surface;
   grinding the back of the wafer so that the thickness of the wafer is reduced to a thickness whereby the grooves are exposed at the back surface which results in a division of the wafer into individual chips with spaces therebetween;
   sticking a dicing/die bond sheet onto the ground back of the wafer, said dicing/die bond sheet comprising a base and, superimposed thereon, an adhesive layer;
   performing a primary curing of the adhesive layer;
   cutting the adhesive layer of the dicing/die bond sheet between neighboring individual chips;
   detaching the individual chips having the cut adhesive layer adhering thereto from the base of the dicing/die bond sheet;
   attaching the individual chips through the adhesive layer to a given substrate; and
   performing a secondary curing of the adhesive layer to thereby secure the individual chips to the substrate.

3. A process for producing a semiconductor device, comprising the steps of:
   providing a wafer of given thickness having a surface furnished with semiconductor circuits and a back;
   forming grooves of a cut depth smaller than the thickness of the wafer, said grooves extending from the wafer circuit surface;
   sticking a surface protective sheet onto the wafer circuit surface;
   grinding the back of the wafer so that the thickness of the wafer is reduced to a thickness whereby the grooves are exposed at the back surface which results in a division of the wafer into individual chips with spaces therebetween;
   sticking a die bond sheet onto the ground back of the wafer, said die bond sheet comprising a base and, superimposed thereon, a thermoplastic adhesive layers;
   cutting the thermoplastic adhesive layer of the die bond sheet between neighboring individual chips;
   detaching the individual chips having the cut thermoplastic adhesive layer adhering thereto from the base of the die bond sheet;
   attaching the individual chips through the thermoplastic adhesive layer to a given substrate; and
   heating the thermoplastic adhesive layer to thereby secure the individual chips to the substrate.

4. The process as claimed in claim 1, wherein the surface protective sheet has an energy radiation curable pressure sensitive adhesive layer, and wherein the energy radiation curable pressure sensitive adhesive layer of the surface protective sheet is cured after the sticking of the surface protective sheet to the wafer circuit surface but before the grinding of the back of the wafer.

5. The process as claimed in claim 2, wherein the surface protective sheet has an energy radiation curable pressure sensitive adhesive layer, and wherein the energy radiation curable pressure sensitive adhesive layer of the surface protective sheet is cured after the sticking of the surface protective sheet to the wafer circuit surface but before the grinding of the back of the wafer.

6. The process as claimed in claim 3, wherein the surface protective sheet has an energy radiation curable pressure sensitive adhesive layer, and wherein the energy radiation curable pressure sensitive adhesive layer of the surface protective sheet is cured after the sticking of the surface protective sheet to the wafer circuit surface but before the grinding of the back of the wafer.

* * * * *

UNITED STATES PATENT AND TRADEMARK OFFICE
CERTIFICATE OF CORRECTION

PATENT NO.    : 6,558,975 B2
DATED         : May 6, 2003
INVENTOR(S)   : Takashi Sugino et al.

It is certified that error appears in the above-identified patent and that said Letters Patent is hereby corrected as shown below:

Column 13,
Line 63, after "adhesive layer" and before the semicolon, insert:
-- , wherein the energy radiation curable pressure sensitive adhesive layer directly contacts the ground back of the wafer --.

Column 14,
Line 18, after "an adhesive layer" and before the semicolon, insert:
-- , wherein the adhesive layer directly contacts the ground back of the wafer --.
Line 46, after "a thermoplastic adhesive" delete "layers" and insert:
-- layer, wherein the thermoplastic adhesive layer directly contacts the ground back of the wafer --.

Signed and Sealed this

Twenty-eighth Day of October, 2003

JAMES E. ROGAN
*Director of the United States Patent and Trademark Office*